US006867152B1

(12) United States Patent
Hausmann et al.

(10) Patent No.: US 6,867,152 B1
(45) Date of Patent: Mar. 15, 2005

(54) PROPERTIES OF A SILICA THIN FILM PRODUCED BY A RAPID VAPOR DEPOSITION (RVD) PROCESS

(75) Inventors: Dennis M. Hausmann, Los Gatos, CA (US); Adrianne K. Tipton, Fremont, CA (US); Patrick A. Van Cleemput, Sunnyvale, CA (US); Bunsen Nie, Fremont, CA (US); Francisco J. Juarez, Fremont, CA (US); Teresa Pong, Dublin, CA (US)

(73) Assignee: Novellus Systems, Inc., San Jose, CA (US)

(*) Notice: Subject to any disclaimer, the term of this patent is extended or adjusted under 35 U.S.C. 154(b) by 3 days.

(21) Appl. No.: 10/672,309

(22) Filed: Sep. 26, 2003

(51) Int. Cl.[7] .................... H01L 21/31; H01L 21/469
(52) U.S. Cl. .................... 438/778; 438/909; 438/935
(58) Field of Search ................ 438/778, 781, 438/789, 790, 907, 909, 935

(56) References Cited

U.S. PATENT DOCUMENTS

| | | | |
|---|---|---|---|
| 6,030,881 A | 2/2000 | Papasouliotis et al. |
| 6,335,261 B1 | 1/2002 | Natzle et al. |
| 6,503,330 B1 | 1/2003 | Sneh et al. |
| 6,511,399 B2 | 1/2003 | Mc Collum Etchason et al. |
| 6,511,539 B1 | 1/2003 | Raaijmakers |
| 6,540,838 B2 | 4/2003 | Sneh et al. |
| 6,551,339 B2 | 4/2003 | Gavronsky |

FOREIGN PATENT DOCUMENTS

WO    WO02/27063    4/2002

OTHER PUBLICATIONS

"Atomic Layer Deposition of Metal Oxide Thin Films," A thesis presented by Dennis Michael Hausmann, Harvard University, 186 pages, Jul. 2002.

Hausmann et al., "Rapid Vapor Deposition of Highly Conformal Silica Nanolaminates," Science, vol. 308, Oct. 2002, 5 Pages.

Primary Examiner—Phuc T. Dang
(74) Attorney, Agent, or Firm—Beyer Weaver & Thomas LLP

(57) ABSTRACT

A rapid vapor deposition (RVD) method conformally deposits a dielectric material on small features of a substrate surface. The resulting dielectric film has a low dielectric constant, low wet etch rate, low film shrinkage and low stress hysteresis, appropriate for various integrated circuit dielectric gap fill applications such as shallow trench isolation. The method includes the following two principal operations: depositing a thin conformal and saturated layer of aluminum-containing precursor over some or all of the substrate surface; and exposing the saturated layer of aluminum-containing precursor to a silicon-containing precursor gas to form a dielectric layer. In some cases, the substrate temperatures during contact with silicon-containing precursor are greater than about 250 degree Celsius to produce an improved film. In other cases, post-deposition anneal process may be used to improve properties of the film. Generally an inert gas purge is employed between the introduction of reactant gases to remove byproducts and unused reactants. These operations can be repeated to deposit multiple layers of dielectric material until a desired dielectric thickness is achieved.

31 Claims, 2 Drawing Sheets

PROPERTIES OF A SILICA THIN FILM PRODUCED BY A RAPID VAPOR DEPOSITION (RVD) PROCESS

FIELD OF THE INVENTION

This invention pertains to methods for forming thin dielectric films. More specifically, the invention pertains to methods that deposit a conformal film of dielectric material on a semiconductor device, especially for gap-fill applications such as STI applications, for example.

BACKGROUND OF THE INVENTION

Conformal, uniform dielectric films have many applications in semiconductor manufacturing. One use of dielectric films is for the electrical isolation of adjacent transistors built on the same silicon wafer. Electrical isolation can be accomplished by employing a technology commonly known as shallow trench isolation (STI). In STI, trenches are etched into the silicon between adjacent transistor components and an insulating dielectric material, such as silicon dioxide, is formed within the trench.

Chemical vapor deposition (CVD) has traditionally been the method of choice for depositing silicon dioxide films into STI trenches. However, as design rules continue to shrink, the aspect ratios (depth to width) of STI features increase, and traditional CVD techniques can no longer provide adequately conformal films in these high aspect ratio features.

An alternative to CVD is atomic layer deposition (ALD). ALD methods involve self-limiting adsorption of reactant gases and can provide thin, conformal dielectric films within high aspect ratio features. An ALD-based dielectric deposition technique typically involves adsorbing a metal containing precursor onto the substrate surface, then, in a second procedure, introducing a silicon oxide precursor gas. The silicon oxide precursor gas reacts with the adsorbed metal precursor to form a thin film of metal doped silicon oxide. One drawback, however, to ALD is that the deposition rates are very low. Films produced by ALD are also very thin (i.e., about one monolayer); therefore, numerous ALD cycles must be repeated to adequately fill a gap feature. These processes are unacceptably slow in the manufacturing environment.

A related technique, referred to as rapid vapor deposition (RVD) processing, is another alternative. RVD is similar to ALD in that reactant gases are introduced alternately over the substrate surface, but in RVD the silicon oxide film can grow more thickly. Thus, RVD methods allow for rapid film growth similar to using CVD methods but with the film conformality of ALD methods. However, the properties of dielectric films formed using known RVD techniques are still not optimal for the high performance needs of today's devices. In particular, the dielectric constant (k) is considerably high. In addition, the wet etch rate, stress and post-anneal shrinkage properties of the film are higher than optimal.

What is therefore needed are improved methods for forming a low-k dielectric material in dielectric gap-fill applications such as forming STI structures.

SUMMARY OF THE INVENTION

The present invention provides a method for using RVD techniques to produce a dielectric film. This method involves two principal operations: 1) exposing the substrate surface with an aluminum-containing precursor to form a saturated surface of aluminum-containing precursor and 2) exposing the saturated surface of precursor to a silicon-containing precursor. In preferred embodiments, the silicon-containing precursor further comprises oxygen.

In some embodiments, 2) occurs with substrate temperatures greater than about 200 degrees Celsius to form a dielectric film. In more specific embodiments, 2) occurs with substrate temperatures between about 250 and 300 degrees Celsius. In some embodiments, 2) is followed by a post-deposition thermal anneal. In other embodiments, 2) occurs with substrate temperatures below 250 degrees Celsius and a post-deposition thermal anneal is employed. For example, in one embodiment, 2) occurs with substrate temperatures of about 200 degrees Celsius and a post-thermal anneal is performed. In some embodiments, the film is made thicker by repeating operations 1) and 2) until the desired thickness is achieved.

One important application for this invention is in the formation of dielectric films over small aspect ratio gaps in semiconductor device fabrication. A particularly important application is in the formation of dielectric films over shallow trench isolation (STI) features.

Any appropriate aluminum-containing precursors and silicon-containing precursors may be used, including those well known in the art. In preferred embodiments, aluminum-containing precursors include hexakis(dimethylamino) aluminum and trimethyl aluminum. Preferred silicon-containing precursors include silanols and a silanediols. Flow rates of aluminum-containing precursor gas can range broadly, e.g., between about 1 and 10000 sccm. Preferred flow rates of aluminum-containing precursor gas range between about 100 and 400 sccm and preferred flow rates of silicon-containing precursor gas range between about 200 and 1000 sccm.

In preferred embodiments, the reaction chamber is purged with an inert gas after substrate exposure to aluminum-containing precursor gas and before exposing the saturated layer of aluminum-containing precursor to a silicon-containing precursor gas. Operations 1) and 2) may occur in the same reaction chamber or in separate reaction chambers, for example, in a multi-chambered apparatus.

In preferred embodiments, the post-deposition thermal anneal occurs using substrate temperatures of between about 400 and 1000 degrees Celsius, more preferably using substrate temperatures greater than 600 degrees Celsius. The deposition and post-deposition thermal anneal processes preferably occur in different reaction chambers, for example, in a multi-chambered apparatus.

DETAILED DESCRIPTION OF SPECIFIC EMBODIMENTS INTRODUCTION

Figure 1:
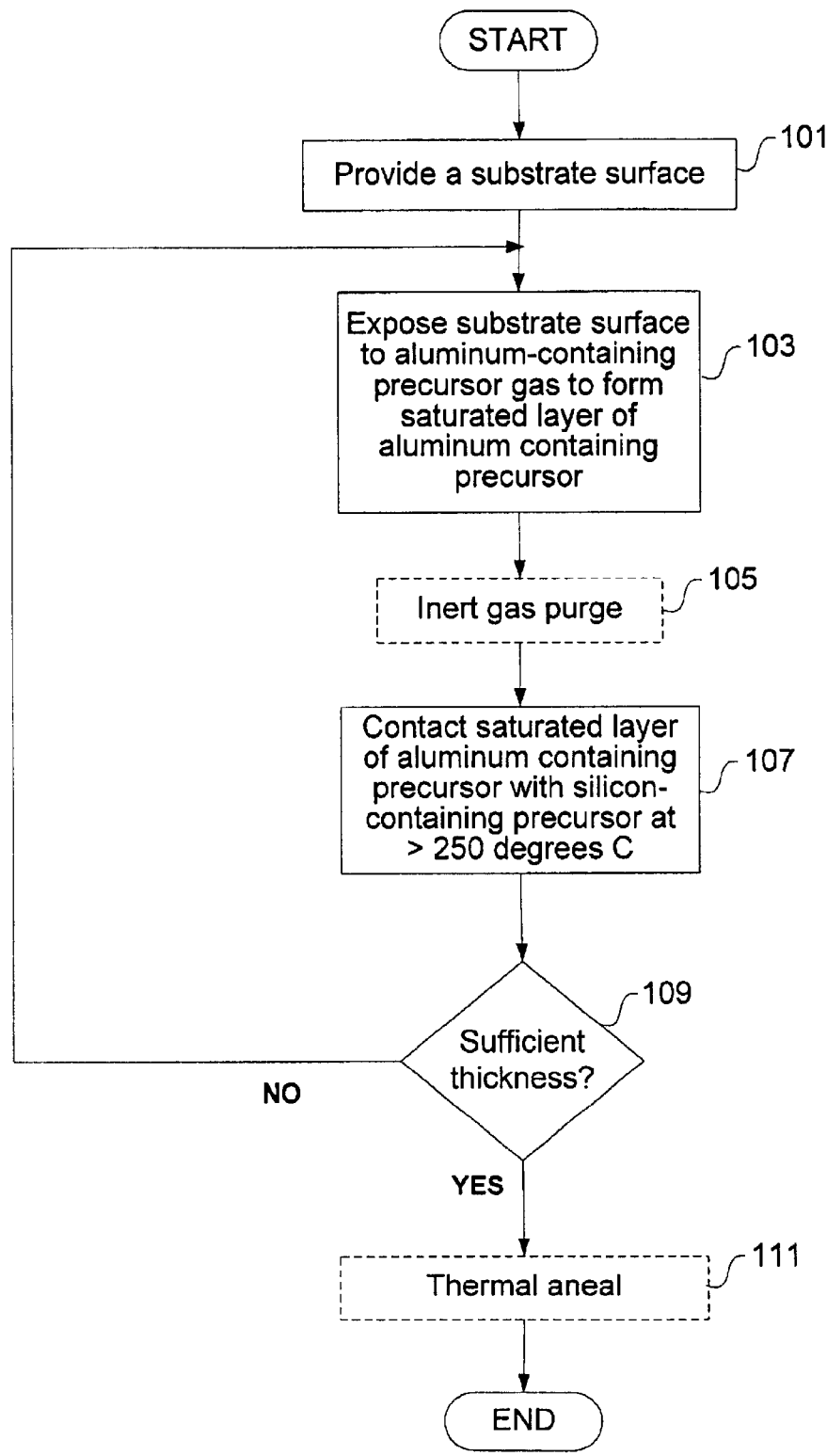
FIG. 1 a process flow diagram illustrating relevant operations employing rapid vapor deposition (RVD) to form a low-k dielectric.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As indicated, the present invention provides methods for depositing a dielectric film having certain desirable material properties, especially for applications in which thin conformal dielectric films are highly preferred such as small aspect ratio gap-fill applications in semiconductor devices. The methods employ Rapid Vapor Deposition (RVD) techniques.

Generally, a RVD method involves sequentially depositing a plurality of atomicscale films on a substrate surface by sequentially exposing and removing reactants to and from the substrate surface. An exemplary case of RVD using reactant gases A and B will now be used to illustrate principle operations of a RVD process in accordance with the present invention. First, gas A is injected into a chamber and the molecules of gas A are chemically or physically adsorbed to the surface of a substrate, thereby forming a "saturated layer" of A. Formation of a saturated layer is self-limiting in nature and represents a thermodynamically distinct state of adsorbed A on a surface. In some cases, a saturated layer is only one monolayer. In other cases, a saturated layer is a fraction of a monolayer, or some multiple of monolayers.

After a saturated layer of A is formed, typically, the remaining gas A in the chamber is purged using an inert gas. Thereafter, the gas B is injected so that it comes in contact with the adsorbed layer of A and reacts to form a reaction product of A and B. Because the saturated layer of A is nominally thin and evenly distributed over the substrate surface, excellent film step coverage can be obtained. B is flowed over the substrate for a period of time sufficient to allow the reaction between A and B to preferably go to completion; i.e., all of the adsorbed A is consumed in the reaction. In a RVD process, B is flowed over the substrate for a period of time sufficient for B to accumulate to thicknesses in excess of one monolayer. After a desired film thickness is achieved, the flow of B is stopped and the reaction is halted. At this point, residual gas B and any byproducts of the reaction are purged from the chamber. Further RVD cycles of substrate exposure to A, followed by exposure to B, can be implemented and repeated as needed for multiple layers of material to be deposited.

RVD methods are related to the well-established chemical vapor deposition (CVD) techniques. However, in CVD, the chemical reactant gases are simultaneously introduced in a reaction chamber and allowed to mix and chemically react with each other in gas phase. The products of the mixed gases are then deposited on the substrate surface. Thus, RVD methods differ from CVD since in RVD the chemical reactant gases are individually injected into a reaction chamber and not allowed to mix prior to contacting the substrate surface. That is, RVD is based on separated surface-controlled reactions.

Another deposition technique related to RVD is atomic layer deposition (ALD). RVD and ALD are both surface-controlled reactions involving alternately directing the reactants over a substrate surface. Conventional ALD, however, depends on self-limiting reactions for both reactant gases. As an example, if reactants C and D are first and second reactant gases for an ALD process, after C is adsorbed onto the substrate surface to form a saturated layer, D is introduced and reacts only with adsorbed C. In this manner, a very thin and conformal film can be deposited. In RVD, as previously described using exemplary reactants A and B, after A is adsorbed onto the substrate surface, B reacts with adsorbed A and is further able to react to accumulate a thicker than one monolayer film. Thus, as stated previously, the RVD process allows for rapid film growth similar to using CVD methods but with the conformality of ALD type methods. In the present invention, this further accumulation of film is accomplished by a catalytic polymerization, which will be discussed in detail further.

The differences between conventional ALD and RVD film formation are principally due to the difference between the thicknesses of the films formed after the completion of each type of process. In the present invention, for example, an aluminum-containing precursor gas is first employed to form an aluminum-containing saturated film and a silicon-containing precursor gas is introduced to react with the adsorbed aluminum-containing saturated film to form a dielectric film. This single process results in a film that is over 10 nm thick, whereas conventional ALD results in a film that is between 0.01 and 0.1 mm thick. Details of preferred embodiments for forming a dielectric film in accordance with the invention will now be described.

RVD Methods for Forming Dielectric Film

As stated above, the present invention provides methods for forming a conformal dielectric film onto a substrate. In preferred embodiments, the dielectric film is derived from RVD deposition using two precursors: an aluminum-containing precursor, which is adsorbed first onto the substrate, and a silicon-containing precursor, which reacts with the adsorbed aluminum-containing precursor. FIG. 1 is a flow chart illustrating principal operations of a preferred embodiment.

Starting at block 101 of FIG. 1, first a substrate surface is provided. For many embodiments of the invention, the substrate is a semiconductor wafer. A "semiconductor wafer" as discussed in this document is a semiconductor substrate at any of the various states of manufacture/fabrication in the production of integrated circuits. As mentioned previously, one commercially important application of the present invention is in various dielectric gap-fill applications such as filling of STI features. In typical STI applications, a trench to be filled is etched into silicon and thus the deposit surface is silicon.

Next, the substrate is exposed to an aluminum-containing precursor to form a saturated layer of aluminum-containing precursor on the substrate surface 103. Any suitable aluminum-containing precursor that can sufficiently adsorb onto the substrate surface and sufficiently react with the subsequently added silicon-containing precursor may be used. In addition, the aluminum-containing precursor should be capable of aiding the catalytic polymerization of the subsequently added silicon-containing precursor to produce a film thicker than a monolayer. In preferred embodiments, for example, hexakis(dimethylamino)aluminum ($Al_2(N(CH_3)_2)_6$) or trimethylaluminum ($Al(CH_3)_3$) are used. Other suitable alumuinum-containing precursors include, for example, triethylaluminum ($Al(CH_2CH_3)_3$) or aluminum trichloride ($AlCl_3$).

As indicated earlier, forming a saturated layer is a self-limiting process and to a certain extent independent of process conditions. Relevant process conditions can include pressure, substrate temperature, and dose. Pressures can range broadly, e.g., between about 1 mTorr and 760 Torr. Typical pressures range between about 100 and 750 mTorr and typical temperatures range between about 250 and 300 degrees Celsius. The dose of aluminum-containing precursor can range broadly, e.g., between about 0.001 milligrams and 10 grams. Typical aluminum-containing precursor doses range between about 0.01 and 0.02 grams. Exposure times suitable for forming a saturated layer are typically only seconds. In some embodiments, for example, an exposure time of about 2 seconds is found to be sufficient.

Returning to FIG. 1, after a saturated layer of aluminum-containing precursor is formed, an inert gas is preferably used to purge the substrate surface and reaction chamber 105. It should be noted that introduction of a purge gas can be used in between operations wherein contact between reactant gases should be avoided, including between each RVD cycle. Further, the purge gas can be flowed continuously during any of these operations and a period or periods between the operations. Purge gases are generally inert. Examples include the noble gases (e.g., argon) and nitrogen. The reaction chamber may additionally be evacuated following inert gas purge.

When the reaction chamber is sufficiently purged, next the saturated layer of aluminum-containing precursor is contacted with a silicon-containing precursor gas at substrate temperatures greater than about 250 degrees Celsius (107). Any suitable silicon-containing precursor that can sufficiently adsorb onto and react with the saturated layer of aluminum-containing precursor to form a dielectric film may be used. In addition, the silicon-containing precursor should be capable of polymerization when exposed to the adsorbed aluminum-containing precursor to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol (($C_4H_9O)_3SiOH$), tris(tert-pentoxy)silanol (($C_5H_{11}O)_3SiOH$), ,di(tert-butoxy)silandiol (($C_4H_9O)_2Si(OH)_2$) and methyl di(tert-pentoxy)silanol.

While the invention is not limited to this theory of operation, as mentioned previously, it is believed that the accumulation of dielectric film is achieved via a polymerization process. The saturated layer of aluminum atoms (after the first operation) can catalytically polymerize the silicon-containing precursor to produce growing chains of silica. After a period of growth determined by the substrate temperature, the silica polymer can "gel" or "cross-link" to form a solid silicon dioxide. The final film thickness depends on the silicon dioxide layer formation rate and the amount of time the silicon containing precursor is exposed to the saturated layer of aluminum atoms. The film can also be made thicker by repeating the number of precursor deposition cycles. Studies regarding these finding can be found in the doctoral thesis of Dennis Hausmann, Harvard University, (2002).

As indicated earlier, one distinction between the present invention and previous RVD-related work lies in characteristic material properties of the resultant film and the process characteristics selected to achieve these properties. In particular, a film with a lower dielectric constant (k) (e.g., below about 6 and as low as about 5 or lower), a lower wet etch rate ratio (WERR) relative to thermally deposited silicon dioxide (e.g., below a ratio of about 5, and as low as 4 or lower), a lower post-anneal film shrinkage percentage (e.g., below about 5 and as low as about 3) and lower compressive film stress level (e.g., below about 0.5 Gdyne/$cm^2$) and as low as 0.05 Gdyne/$cm^2$ (compressive) or lower) can be obtained by using the process conditions of the present invention. These film properties are advantageous for many low-k dielectric applications in semiconductor devices. More comprehensive definitions of these film properties will be provided further in reference to specific examples.

One way to achieve these improved film properties is to increase the substrate temperature above the conventional temperature range during exposure of the silicon-containing precursor. Previous work focused on methods that produce high deposition rates of silica. For example, Hausmann et al., *Rapid Vapor Deposition of Highly Conformal Silica Nanolaminates*, Science 298, 402 (2002) tested dielectric deposition rates for temperatures ranging from 200 to 450 degrees Celsius during exposure of the silicon-containing precursor in a RVD type process. It was reported that high deposition rates (12 nm per cycle and higher) were obtained by applying substrate temperatures between 225 and 250 degrees Celsius. This work shows that using temperatures above or below this 225–250 degrees Celsius range resulted in substantially decreased film growth rates and, as such, were disfavored for the desired high dielectric deposition rates. In the present invention, using temperatures above about 250 degrees Celsius, in particular between about 250 and 300 degrees Celsius, was found to yield dielectric film with improved material properties not considered in the previous work. Although not wishing to be bound by theory, it is believed that the use of substrate temperatures in this sub-range helps to prevent the adsorption of water or to desorb any adsorbed water on the substrate surface during deposition, leading to the improved material properties Other process parameters during exposure to silicon-containing precursor including gas pressure, dose and exposure times will vary depending on the types of precursors used, reaction chamber configuration and desired final film thickness, among other variables. Pressures can range broadly, e.g., between about 1 mTorr and 760 Torr. Typical pressures range between about 100 and 750 mTorr. The dose of silicon-containing precursor can range broadly, e.g., between about 0.001 milligrams and 100 grams. Typical silicon-containing precursor doses range between about 0.1 and 0.3 grams. Exposure times can range broadly, e.g., between about 1 milliseconds and 100 seconds. Preferred exposure times typically range between about 1 and 10 seconds. The number of separate exposures to silicon-containing precursor will primarily depend upon the desired final film thickness. Typical numbers of silicon-containing precursor exposure cycles for a STI feature 0.1 micron in diameter range between about 4 and 7.

Referring back to FIG. 1, after exposure to a silicon-containing precursor and formation of a dielectric film, if the dielectric film is not yet of desired thickness, subsequent cycles of the RVD process can be repeated until a desired thickness is achieved. See decision 109 of FIG. 1. For many STI applications, for example, the total film thickness ranges between about 500 and 1000 angstroms.

Again returning to FIG. 1, after the desired dielectric film thickness is achieved, an optional thermal anneal process may be employed 111. This post-deposition thermal anneal is found to be another way of improving RVD film properties. A typical thermal anneal process uses substrate temperatures between about 400 and 1000 degrees Celsius. Preferred thermal anneal temperatures are greater than 600 degrees Celsius. Alternatively, annealing operations may be conducted between RVD cycles.

Such a post-deposition thermal anneal process may also be employed with processes in which the exposure to silicon-containing precursor gas (see block 107) occurs at substrate temperatures below 250 degrees C., for example 200 to 250 degrees C. The post deposition thermal anneal improves the RVD film properties as described herein to some extent. Accordingly, such a process, involving a post-deposition thermal anneal on a substrate exposed to silicon-containing precursor gas at substrate temperatures below 250 degrees C. in a RVD process, is one aspect of the present invention.

After the dielectric film of desired thickness is formed, the flow chart of FIG. 1 is complete. In semiconductor wafer fabrication applications, the substrate is subsequently processed appropriately. In STI applications, this typically includes processes such as formation of retrograde wells, gate oxide formation, formation of the gate stack, formation of the source and drain junctions, silicides formation, pre-metal dielectric deposition and interconnect structure formation. An example of a suitable reaction chamber for the present invention will now be described.

Note alternative embodiment of RVD at conventional temperatures followed by anneal, per claims 19–25.

RVD Apparatus

Figure 2:
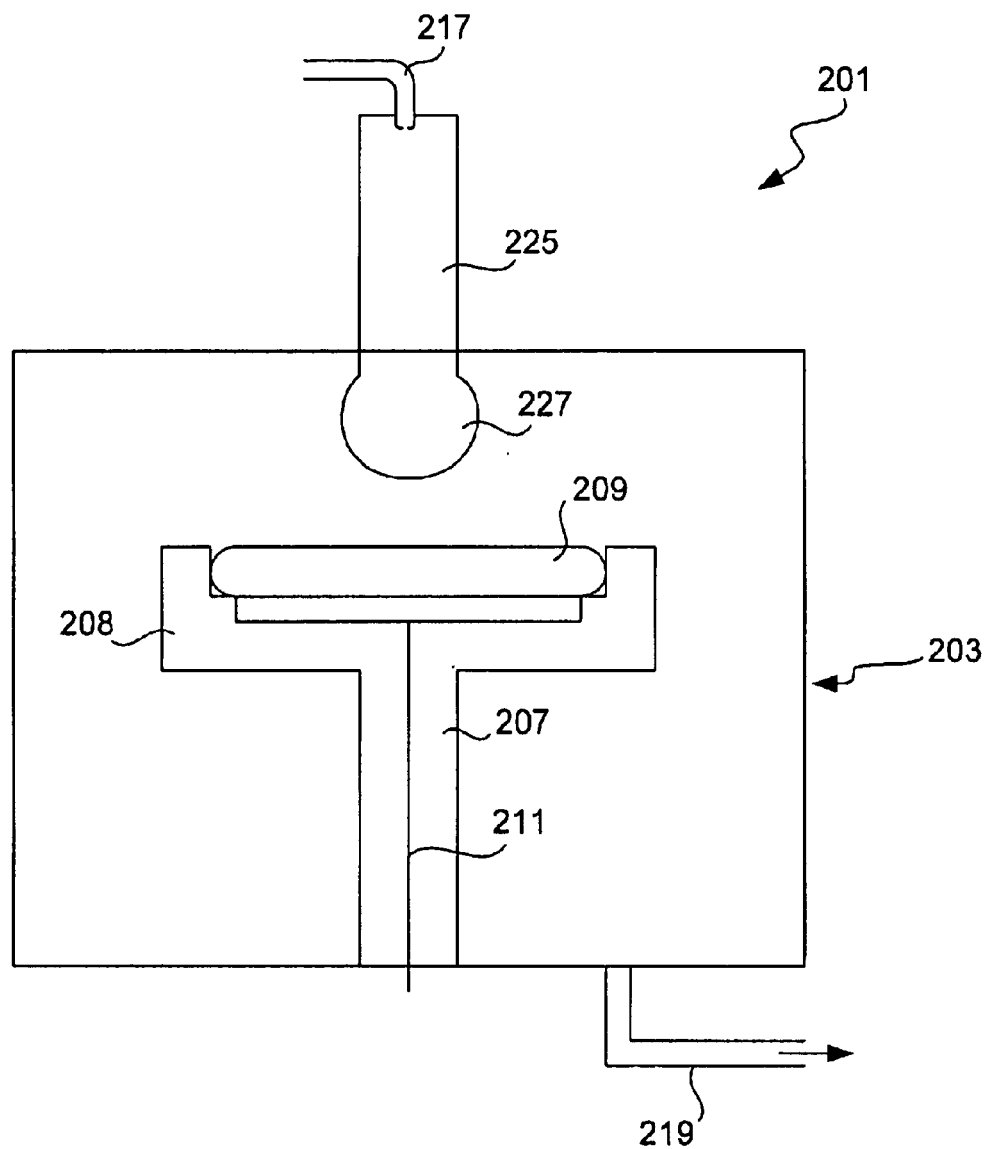
FIG. 2 is a schematic diagram showing the basic features of a RVD reactor suitable for practicing the current invention.

FIG. 2 is a block diagram depicting some components of a suitable dual source RF/microwave plasma reactor for performing a RVD process in accordance with this invention. Note that this apparatus is only an example of suitable apparatus for RVD processes in accordance with the present invention. Many other apparatuses and systems, including a multi-chambered apparatus, may be used.

As shown, a reactor 201 includes a process chamber 203, which encloses components of the reactor and serves to contain the reactant gases and provide and area to introduce the reactant gases to substrate 209. In one example, the process chamber walls are made from aluminum. Within the process chamber, a wafer pedestal 207 supports a substrate 209. The pedestal 207 typically includes a chuck 208 to hold the substrate in place during the deposition reaction. The chuck 208 may be an electrostatic chuck, a mechanical chuck or various other types of chuck as are available for use in the industry and/or research.

A heat transfer subsystem including lines 211 for supplying a heat transfer fluid to the pedestal 207 controls the temperature of pedestal 207. In some embodiments, the heat transfer fluid comprises water or another liquid. The reactant gases, as well as inert gases during purge, are introduced individually into the reactor at tube 225 via inlet 217. A showerhead 227 may be used to distribute the gas flow uniformly in the process reactor. Reactant gases are introduced through a gas supply inlet mechanism including orifices. A vacuum pump (e.g., a turbomolecular pump) connected to outlet 219 can draw out gases between RVD cycles.

Although various details of the apparatus have been omitted for clarity's sake, various design alternatives may be implemented. Therefore, the present examples are to be considered as illustrative and not restrictive, and the invention is not to be limited to the details given herein, but may be modified within the scope of the appended claims.

EXAMPLES

The following examples provide details concerning the implementation of the present invention. It should be understood the following is representative only, and that the invention is not limited by the detail set forth in these examples.

As described previously, the present invention involves using a deposition temperature (during exposure to silicon-containing precursor) greater than about 250 degrees Celsius and/or a post-deposition thermal anneal to provide a dielectric film with improved properties. Several experiments were performed to show the effects on the resultant dielectric film using different deposition temperatures and thermal anneal temperatures.

Example 1

Film 1 and Film 2 were deposited using the following procedures.

A. Film 1 was deposited using a substrate temperature of about 200 degrees Celsius.

B. Film 2 was deposited using a substrate temperature of about 300 degrees Celsius.

C. Film 1 was further treated with a thermal anneal (1 hour at about 600 degrees Celsius).

D. Film 2 was further treated with a thermal anneal (1 hour at about 600 degrees Celsius).

After procedure A, Film 1 is measured and found to have k of about 6.9, a wet etch rate ratio (WERR) of about 6.7 and a post-anneal shrinkage percentage of about 6.1%. As stated previously, k refers to the dielectric constant of the film. A typical thermally grown silicon dioxide film has k of about 4. Water has a k of about 80. The WERR is the ratio of the rate in which the film can be etched relative to thermally grown silicon dioxide, which has a nominally low wet etch rate. Thus the WERR is reflected as (etch rate of the film)/(etch rate of thermally grown silicon dioxide). The post-anneal thermal shrinkage refers to the amount of reduced film thickness after a high temperature anneal process (i.e., at around 600 degrees Celsius for about 1 hour) as a percentage of the total pre-anneal thickness.

After procedure B, Film 2 has k of about 5.0, WER of about 5.5 and a post-anneal shrinkage percentage of about 3.4. It is noted that all three types of film properties are lower than Film 1 after procedure A. Thus, increasing the deposition temperature from about 200 to about 300 degrees Celsius results in dielectric films with different film properties. It is also expected that increasing the deposition temperature about 300 degrees Celsius will similarly result in a film with different film properties.

After procedure C, Film 1 has k of about 4.1 and WER of about 3.3. After procedure D, Film 2 has k of about 4.2 and WER of about 2.0. Thus, a post-deposition thermal anneal process of 1 hour at about 600 degrees Celsius also changes the properties of the film. Note that k for both Film 1 and Film 2 are about the same, although WERR was found to be lower for Film 2. Thus, to some extent, a post-deposition thermal anneal process can improve film properties regardless of deposition temperatures.

Example 2

Five films (A, B, C, D and E) were deposited using different deposition temperatures between 200 and 300 degrees Celsius. The film properties of these samples were then measured. Results are summarized in the following table.

| Film | Deposition Temperature (C) | Average Growth Rate (nm/cycle) | Dielectric Constant (k) | Wet etch rate ratio (WERR) | Post 600C Anneal Film Shrinkage | Post 600C Anneal Film Stress (compressive) (Gdyne/cm²) |
|---|---|---|---|---|---|---|
| A | 200 | 14.7 | 7.54 | 6.41 | 6.35% | 1.02 |
| B | 230 | 15.6 | 6.47 | 5.83 | 6.02% | 0.98 |
| C | 250 | 13.3 | 6.11 | 5.37 | 5.48% | 0.64 |
| D | 275 | 8.6 | 5.77 | 4.00 | 3.57% | 0.08 |
| E | 300 | 4.1 | 5.01 | <4* | 3.06% | <0.05* |

As reflected by the forgoing results, k, WERR and the post-anneal shrinkage percentage all decrease as the deposition temperature increases. For example, Film A, which was deposited at 200° C., has a k of 7.54, a WERR of 6.41 and a post-anneal shrinkage percentage of 6.35% while Film E, which was deposited at 300° C., has a k of 5.01, a WER of less than 4 and a post-anneal shrinkage percentage of 3.06%. These results are consistent with the results of Example 1. Note that the WER measurement for Film E, as indicated by the * symbol, was difficult to quantify further due to limitations of the measurement instrumentation and may actually be significantly lower.

In addition to the film properties k, WER and post-anneal shrinkage, the post-anneal film stress was also measured for each film. Results indicate that the post-anneal film stress also decreases as the deposition temperature increases. For example, Film A, which was deposited at 200 C, has a post-anneal compressive film stress of 1.02 Gdyne/cm² while Film E, which was deposited at 300 C, has a post-anneal compressive film stress of less than 0.05 Gdyne/cm². Note that the post-anneal compressive film stress measurement for Film E, as indicated by the * symbol, was difficult to quantify further due to limitations of the measurement instrumentation and may actually be significantly lower.

Another film measurement conducted in the present example is the average growth rate measured in nm/PLD cycle. The average growth rate was calculated as (film thickness after deposition)/(number of PLD cycles). Results indicate that the average growth rate decreases as the deposition temperature increases. For example Film A, deposited at 200 C, had an average growth rate of 14.7 nm/PLD cycle while Film E, deposited at 300 C, had an average growth rate of 4.1 mm/PLD cycle.

All documents cited herein are hereby incorporated by reference in their entirety and for all purposes.

What is claimed is:

1. A method of depositing a dielectric film on a partially fabricated semiconductor device, the method comprising:
    exposing the partially fabricated semiconductor device to an aluminum-containing precursor gas to form a saturated layer of aluminum-containing precursor on the partially fabricated semiconductor device; and
    exposing the saturated layer of aluminum-containing precursor to a silicon-containing precursor gas at substrate temperatures greater than about 250 degrees Celsius to form the dielectric film.

2. The method of claim 1, wherein the silicon-containing precursor further comprises oxygen.

3. The method of claim 1, wherein the dielectric film has a dielectric constant (k) of less than about 6.

4. The method of claim 1, wherein the dielectric film has a wet etch rate ratio (WERR) of less than about 5.

5. The method of claim 1, wherein the dielectric film has a post-anneal shrinkage percentage of about 5%.

6. The method of claim 1, wherein the dielectric film has a post-anneal compressive film stress of less than about 0.5 Gdyne/cm².

7. The method in claim 1, wherein the dielectric film is deposited over gaps in the partially fabricated semiconductor device.

8. The method in claim 7, wherein the dielectric film is deposited over shallow trench isolation (STI) features in the partially fabricated semiconductor device.

9. The method of claim 1, wherein the aluminum-containing precursor is at least one of hexakis (dimethylamino) aluminum and trimethyl aluminum.

10. The method of claim 1, after exposing the partially fabricated semiconductor device to the aluminum-containing precursor gas, further comprising purging with an inert gas before contacting the saturated layer of aluminum-containing precursor with a silicon-containing precursor gas.

11. The method of claim 1, wherein exposing the partially fabricated semiconductor device to the aluminum-containing precursor gas occurs at substrate temperatures between about 250 and 300 degrees Celsius.

12. The method of claim 1, wherein contacting the saturated layer of aluminum-containing precursor with a silicon-containing precursor gas occurs at substrate temperatures between about 250 and 300 degrees Celsius.

13. The method of claim 1, wherein the silicon-containing precursor is at least one of a silanol and a silanediol.

14. The method of claim 1, wherein the silicon-containing precursor is at least one of tris(tert-butoxy)silanol (($C_4H_9O$)$_3$SiOH) and tris(tert-pentoxy)silanol(($C_5H_{11}O$)$_3$SiOH).

15. The method of claim 1, after exposing the saturated layer of aluminum-containing precursor to a silicon-containing precursor gas at substrate temperatures greater than about 250 degrees Celsius, further comprising purging with an inert gas and exposing again the saturated layer of aluminum-containing precursor to a silicon-containing precursor gas at substrate temperatures greater than about 250 degrees Celsius to form an additional layer of dielectric film.

16. The method of claim 1, further comprising purging with an inert gas and repeating exposing the partially fabricated semiconductor device to an aluminum-containing precursor gas and exposing the saturated layer of aluminum-containing precursor to a silicon-containing precursor gas to form an additional layer of dielectric film.

17. The method of claim 1, wherein exposing the partially fabricated semiconductor device to an aluminum-containing precursor gas and exposing the saturated layer of aluminum-containing precursor with a silicon-containing precursor gas occur in the same reaction chamber.

18. The method of claim 1, wherein exposing the partially fabricated semiconductor device to an aluminum-containing precursor gas and exposing the saturated layer of aluminum-containing precursor with a silicon-containing precursor gas occur in different reaction chambers in a multi-chamber apparatus.

19. The method of claim 1, after exposing the saturated layer of aluminum-containing precursor with a silicon-containing precursor gas to form the dielectric film, further comprising a performing post-deposition thermal anneal.

20. The method of claim 19, wherein the post-deposition thermal anneal comprises using substrate temperatures of between about 400 and 1000 degrees Celsius.

21. The method of claim 20, wherein the post-deposition thermal anneal comprises using substrate temperatures greater than 600 degrees Celsius.

22. The method of claim 19, wherein exposing the saturated layer of aluminum-containing precursor to a silicon-containing precursor gas and the post-deposition thermal anneal occur in different reaction chambers separate reaction chambers in individual apparatuses or in separate chambers as part of a multi-chamber apparatus.

23. The method of claim 1, wherein the flow rate of aluminum-containing precursor gas range between about 100 and 400 sccm.

24. The method of claim 1, wherein the flow rate of silicon-containing precursor gas range between about 200 and 1000 seem.

25. A method of forming a dielectric film on a substrate, the method comprising:
   depositing an aluminum-containing precursor gas to form a saturated layer of the aluminum-containing precursor on the partially fabricated semiconductor device;
   exposing the aluminum-containing precursor of the saturated layer to a silicon-containing precursor gas to form the dielectric film; and
   after forming the dielectric film, performing a post-deposition thermal anneal.

26. The method of claim 25, wherein the post-deposition thermal anneal comprises using substrate temperatures between about 400 and 1000 degrees Celsius.

27. The method of claim 26, wherein the post-deposition thermal anneal comprises using substrate temperatures greater than 600 degrees Celsius.

28. The method of claim 25, wherein forming the dielectric film and performing the post-deposition thermal anneal the dielectric film occur in different reaction chambers.

29. The method of claim 25, wherein contacting the aluminum-containing precursor of the saturated layer with a silicon-containing precursor gas occurs at temperatures greater than about 200 degrees Celsius.

30. The method of claim 25, wherein contacting the aluminum-containing precursor of the saturated layer with a silicon-containing precursor gas occurs at temperatures greater than about 250 degrees Celsius.

31. The method of claim 25, wherein contacting the aluminum-containing precursor of the saturated layer with a silicon-containing precursor gas occurs at temperatures between about 250 and 300 degrees Celsius.

* * * * *